US007985079B1

(12) United States Patent
Wilson et al.

(10) Patent No.: US 7,985,079 B1
(45) Date of Patent: Jul. 26, 2011

(54) CONNECTOR ASSEMBLY HAVING A MATING ADAPTER

(75) Inventors: Peter Paul Wilson, Palmyra, PA (US); Phuc Steve Chau, Raleigh, NC (US); Michael David Herring, Apex, NC (US); John Edward Knaub, Etters, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/763,703

(22) Filed: Apr. 20, 2010

(51) Int. Cl.
*H01R 12/00* (2006.01)
(52) U.S. Cl. ........................................................ 439/74
(58) Field of Classification Search .................. 439/74, 439/75
See application file for complete search history.

(56) References Cited

U.S. PATENT DOCUMENTS

| 5,181,855 | A | * | 1/1993 | Mosquera et al. | 439/74 |
| 5,477,933 | A | | 12/1995 | Nguyen | |
| 5,641,291 | A | * | 6/1997 | Sueki et al. | 439/83 |
| RE36,442 | E | | 12/1999 | Kardos | |
| 7,220,135 | B1 | * | 5/2007 | Brekosky et al. | 439/75 |
| 7,591,652 | B2 | * | 9/2009 | Goto et al. | 439/74 |
| 2003/0013325 | A1 | * | 1/2003 | Zaderej et al. | 439/74 |
| 2010/0291776 | A1 | * | 11/2010 | Huang et al. | 439/74 |

* cited by examiner

*Primary Examiner* — Gary F. Paumen

(57) ABSTRACT

A connector assembly includes an electrical connector having an outer end and a plurality of pins at the outer end. The connector assembly also includes a mating adapter having a mating interface and a mounting interface. The mating interface engages the outer end and the mounting interface is configured to engage a circuit board. The mating adapter has conductors extending between the mating interface and the mounting interface. The conductors receive corresponding pins of the electrical connector. The mating adapter has surface mount elements arranged on the mounting interface that are electrically connected to corresponding conductors and are configured to be terminated to the circuit board to electrically interconnect the electrical connector and the circuit board.

19 Claims, 4 Drawing Sheets

US 7,985,079 B1

CONNECTOR ASSEMBLY HAVING A MATING ADAPTER

BACKGROUND OF THE INVENTION

The subject matter herein relates generally to electrical connectors and, more particularly, to a connector assembly that mechanically and electrically connects circuit boards.

Known mezzanine connectors mechanically and electrically interconnect a pair of circuit boards. The mezzanine connectors engage each of the circuit boards to mechanically interconnect the circuit boards. The circuit boards are separated from one another by a stack height when interconnected by the mezzanine connector. Signal contacts in the mezzanine connectors mate with the circuit boards and provide an electrical connection between the circuit boards. The signal contacts permit the communication of data or control signals between the circuit boards.

At least some known mezzanine connectors include press-fit contacts at the mating interfaces thereof for mating with the circuit boards. The circuit boards include plated vias that receive the press-fit contacts. One problem with using such mezzanine connectors and plated vias is that the footprint of the plated vias creates a dead-zone in the circuit board, wherein routing of signal traces in the dead-zone is not possible. As such, traces to and/or from components mounted on the circuit board proximate to the mezzanine connector, such as processors or other electrical components, must be routed around the footprint of the mezzanine connector.

Thus, a need exists for a connector system that provides a cost effective and reliable connection to a circuit board. A need remains for a connector system that allows an electrical connector having press-fit contacts to interface with a circuit board having traces routed through the board in the area of the footprint of the electrical connector.

BRIEF DESCRIPTION OF THE INVENTION

In one embodiment, a connector assembly is provided including an electrical connector having an outer end and a plurality of pins at the outer end. The connector assembly also includes a mating adapter having a mating interface and a mounting interface. The mating interface engages the outer end and the mounting interface is configured to engage an circuit board. The mating adapter has conductors extending between the mating interface and the mounting interface. The conductors receive corresponding pins of the electrical connector. The mating adapter has surface mount elements arranged on the mounting interface that are electrically connected to corresponding conductors and are configured to be terminated to the circuit board to electrically interconnect the electrical connector and the circuit board.

In another embodiment, a connector assembly is provided including an electrical connector having first and second outer ends being configured to mate with first and second circuit boards, respectively, to electrically interconnect the first and second circuit boards. The electrical connector has first pins at the first outer end and the electrical connector has second pins at the second outer end. The connector assembly also includes a first mating adapter having a mating interface and a mounting interface. The mating interface engages the first outer end and the mounting interface is configured to engage the first circuit board. The first mating adapter has conductors extending between the mating interface and the mounting interface. The conductors receive corresponding first pins of the electrical connector. The first mating adapter has surface mount elements arranged on the mounting interface that are electrically connected to corresponding conductors and are configured to be terminated to the first circuit board to electrically interconnect the electrical connector and the first circuit board.

In a further embodiment, a connector assembly is provided that includes an electrical connector having an outer end and a plurality of pins at the outer end. The press fit pins have a predetermined pinout defining a first footprint having a first area. The connector assembly also includes a mating adapter having a mating interface and a mounting interface. The mating interface engages the outer end and the mounting interface is configured to engage a circuit board. The mating adapter receives the pins of the electrical connector and has surface mount elements arranged on the mounting interface. The surface mount elements are arranged in a predetermined pinout defining a second footprint having a second area different than the first area.

DETAILED DESCRIPTION OF THE INVENTION

Figure 1:
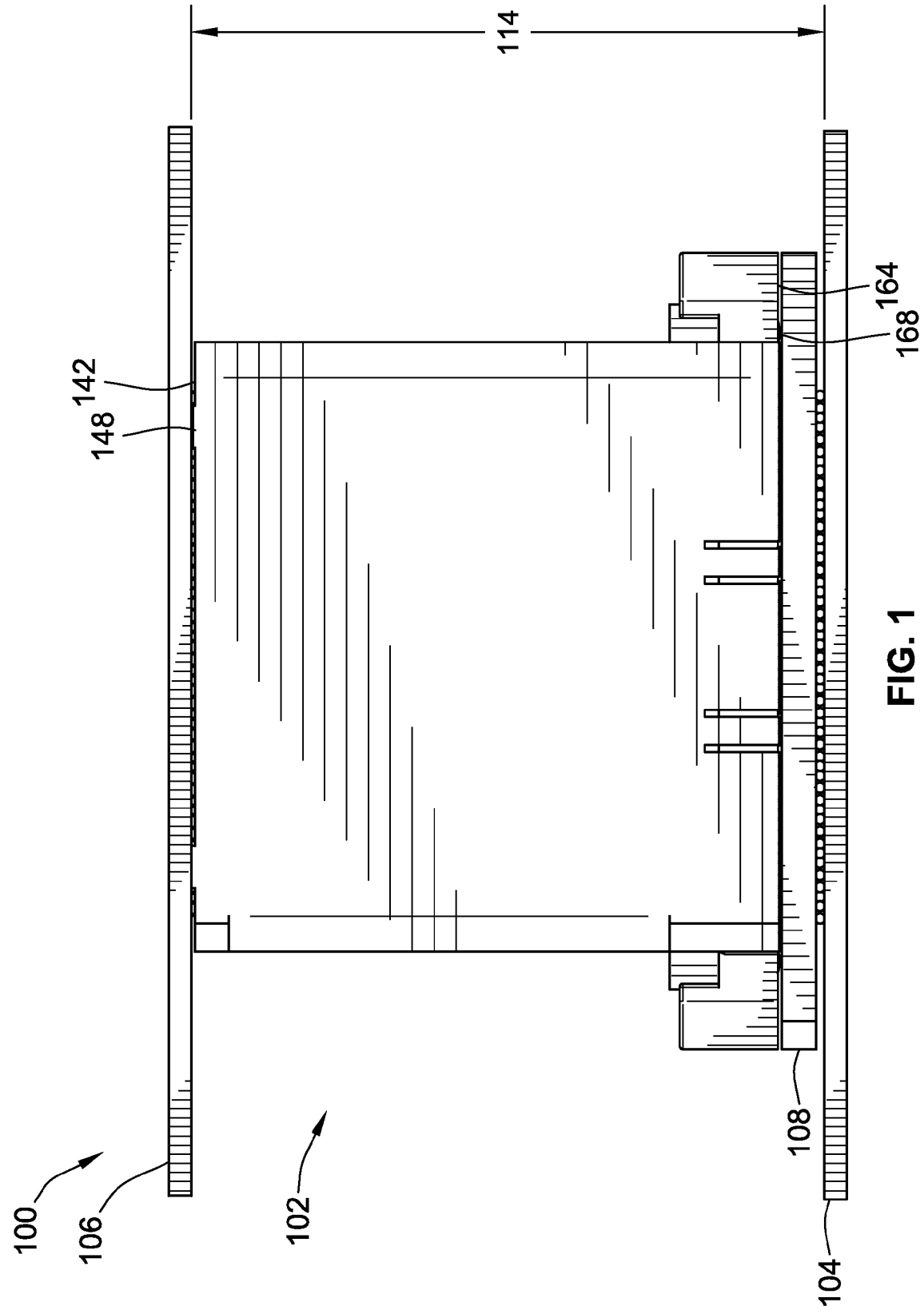
FIG. 1 is a side view of a connector assembly according to one embodiment.

FIG. 1 is a side view of a connector assembly 100 according to one embodiment. The connector assembly 100 includes an electrical connector 102 that mechanically and electrically connects first and second circuit boards 104, 106. In the illustrated embodiment, the electrical connector 102 constitutes a mezzanine connector arranged to interconnect the first and second circuit boards 104, 106 in a parallel arrangement, and may be referred to hereinafter as a mezzanine connector 102. However, it is realized that the subject matter herein may be used in other types of electrical connectors as well, such as right angle connectors, cable connectors (being terminated to an end of one or more cables with an opposite interface for a circuit board), or other types of electrical connectors.

In the illustrated embodiment, a mating adapter 108 is arranged between the mezzanine connector 102 and the first circuit board 104. The mating adapter 108 electrically interconnects the mezzanine connector 102 and the first circuit board 104. The mezzanine connector 102 is directly mounted to the second circuit board 106 to electrically and mechanically couple the second circuit board 106 to the first circuit board 104 via the adapter 108.

In an alternative embodiment, the mating adapter 108 may be provided between the mezzanine connector 102 and the second circuit board 106. Optionally, a second mating adapter 109 (shown in phantom in FIG. 2) similar to the mating adapter 108 may be provided between the mezzanine connector 102 and the second circuit board 106, in addition to the mating adapter 108 being provided between the mezzanine connector 102 and the first circuit board 104. The second mating adaptor 109 may include similar features as the first mating adaptor 108 to electrically interconnect the mezzanine connector 102 and the second circuit board 106.

As shown in FIG. 1, the circuit boards 104, 106 are interconnected by the mezzanine connector 102 so that the circuit boards 104, 106 are substantially parallel to one another. In an exemplary embodiment, the first circuit board 104 is a motherboard and the second circuit board 106 is a daughter board. The first and second circuit boards 104, 106 include conductors that communicate data signals and/or electric power between the circuit boards 104, 106 and one or more electric components (not shown) that are electrically connected to the circuit boards 104, 106. The conductors may be embodied in electric pads or traces deposited on one or more layers of the circuit boards 104, 106, in plated vias, or in other conductive pathways, contacts, and the like.

The mezzanine connector 102 and the adapter 108 separate the first and second circuit boards 104, 106 by a stack height 114. The stack height 114 may be approximately constant along a length of the mezzanine connector 102. The stack height 114 may be varied by connecting the first and second circuit boards 104, 106 using different mezzanine connectors 102 and/or mating connectors 108 having different thicknesses. For example, differently sized mezzanine connectors 102 and/or mating connectors 108 may be provided, defining a family of mezzanine connectors 102 and mating connectors 108. The different members of the families have different thicknesses so that the stack height 114 may be selected by an operator. Optionally, the mezzanine connectors 102 may come in predetermined thickness increments, such as 2 mm increments. The mating connectors 108 may have almost infinitely variable thicknesses, depending on the desired stack height 114. For example, for assembly, an operator may select one mezzanine connector 102 having a thickness less than the desired stack height 114 and then select a corresponding mating adapter 108 having a predetermined thickness that complements the selected mezzanine connector 102 to achieve the desired stack height 114.

In an exemplary embodiment, the mezzanine connector 102 includes individual contacts, such as stamped and formed contacts, that are manufactured in certain height increments, which controls the overall thickness of the mezzanine connector 102. In contrast, the mating adapter 108 includes plated vias through a circuit board, where the circuit board and plated vias can be manufactured at various heights relatively easily. As such, it may be cost effective to control the stack height 114 by utilizing the mating adapter 108 between the mezzanine connector 102 and the circuit board 104.

Figure 2:
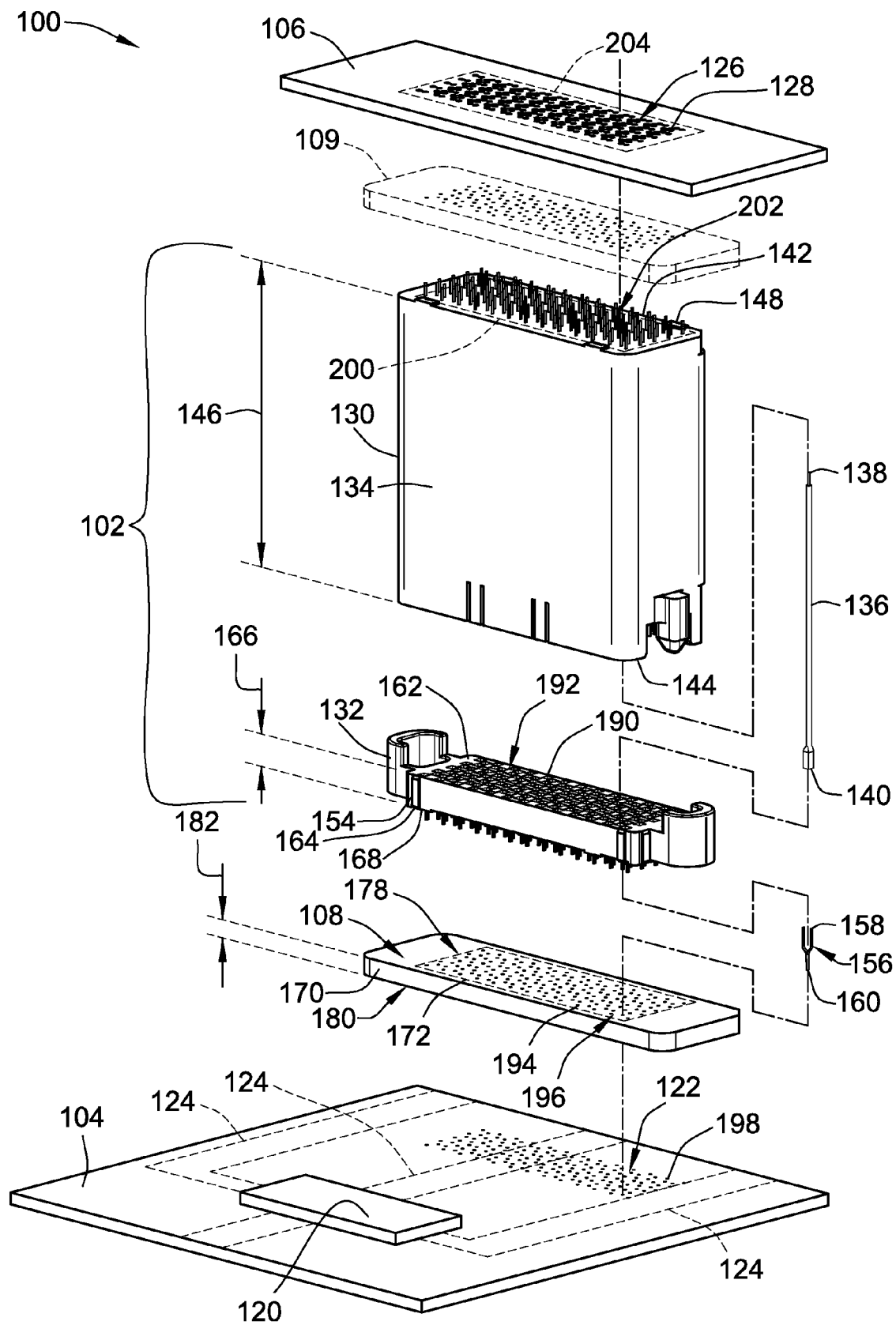
FIG. 2 is an exploded view of the connector assembly shown in FIG. 1.

FIG. 2 is an exploded view of the connector assembly 100, illustrating the circuit boards 104, 106, the mezzanine connector 102 and the mating adapter 108. An electronic component 120 is mounted on the first circuit board 104 adjacent to a mounting area 122. The mounting area 122 is the area on which the mezzanine connector 102 and mating adapter 108 are mounted. In one embodiment, the electronic component 120 is a processor. Data signals to and from the electronic component 120 are transmitted along transmission paths 124 spanning out from the electronic component 120. For example, the transmission paths 124 may be defined by traces routed through different layers of the circuit board 104. Optionally, at least some of the transmission paths 124 are routed through the circuit board 104 directly below the mounting area 122. Such may be the case when the circuit board 104 is densely populated with electronic components and connectors. When the transmission paths 124 are routed directly below the mounting area 122, it may not be possible to provide plated vias in the circuit board 104 at the mounting area 122. For example, the transmission paths 124 need to be a predetermined distance from plated vias to avoid signal degradation. In an embodiment in which no plated vias are provided in the mounting area 122, the mezzanine connector 102 and mating adapter 108 need to be surface mounted to the circuit board 104.

In an exemplary embodiment, and as described in further detail below, the mating adapter 108 facilitates surface mounting to the circuit board 104 by providing a surface mountable interface. In an exemplary embodiment, and as described in further detail below, the mezzanine connector 102 includes pins that are mounted in plated vias, rather than being surface mounted. The mating adapter 108 provides an interface that allows the mezzanine connector 102, with the pins, to be mounted to the circuit board 104 in a cost effective and reliable manner. The mating adapter 108 provides an interface that allows the circuit board 104 to have transmission paths 124 routed below the mounting area 122.

The second circuit board 106 includes a mounting area 126, to which the mezzanine connector 102 is connected. In the illustrated embodiment, the second circuit board 106 includes a plurality of plated vias 128 in the mounting area 126. The plated vias 128 are arranged in a predetermined pattern, such as in a matrix of rows and columns. The plated vias 128 may define signal vias, ground vias and/or power vias. In an alternative embodiment, rather than plated vias, the circuit board 106 may include transmission paths that pass through the mounting area 126, and thus restrict use of plated vias in the mounting area 126. The circuit board 106 may rather include contact pads or other conductive elements at or near the surface thereof. As such, the mounting area 126 may be restricted to surface mounting interfaces, such as by using a mating adapter similar to the mating adapter 108.

In an exemplary embodiment, the mezzanine connector 102 comprises two parts, a header connector 130 and a receptacle connector 132. Alternatively, the mezzanine connector 102 may include more or less than two parts. The header connector 130 includes a header housing 134 holding a plurality of header contacts 136, one of which is illustrated outside of the header housing 134 for clarity. The header contacts 136 extend between first and second ends 138, 140. The header housing 134 extends between a mating end 142 and a mounting end 144, and has a thickness 146 defined between the mating and mounting ends 142, 144. The mating end 142 defines an outer end of the mezzanine connector 102 (and may be referred to hereinafter as outer end 142) for mating with another component, such as the circuit board 106 or the mating adaptor 109, depending on the particular application. The header contacts 136 extend from the outer end 142 for mating with the circuit board 106 or the mating adaptor 109. The mating end 142 is generally at a top and the mounting end 144 is generally at a bottom, where the header housing 134 is assembled in a downward direction such that the mounting end 144 of the header housing 134 is mounted to the receptacle connector 130. However, it is realized that the mating and mounting ends may be swapped and/or the header housing 134 may be assembled differently. The header housing 134 may comprise multiple housing pieces assembled together into a single body. Optionally, the header housing 134 may include standoffs 148 at the mating end 142 that engage the circuit board 106 when assembled thereto. As shown in FIG. 1, the standoffs 148 provide clearance between the circuit board 106 and the mating end 142, which may define an air gap therebetween. The air gap may cool the components.

The header contacts 136 are held by the header housing 134 such that the first ends 138 of the header contacts 136 are arranged proximate to the mating end 142 and the second ends 140 are arranged proximate to the mounting end 144. In an exemplary embodiment, the first ends 138 define pins that extend outward from the mating end 142, and are thus exposed beyond the mating end 142. The first ends 138 may be referred to hereinafter as pins 138. In an exemplary embodiment, the pins 138 constitute press-fit pins having compliant portions that allow the first ends 138 to be terminated into the plated vias 128 of the second circuit board 106 by an interference fit. Alternatively, the pins 138 may constitute solder pins that may be received in plated vias and terminated thereto using reflowed solder. The second ends 140 define pins or blades that are configured to mate with corresponding contacts of the receptacle connector 132 when mated thereto. Other types of mating interfaces may be provided in alternative embodiments at the first and/or second ends 138, 140.

The receptacle connector 132 includes a receptacle housing 154 holding a plurality of receptacle contacts 156, one of which is illustrated outside of the receptacle housing 154 for clarity. The receptacle contacts 156 extend between first and second ends 158, 160. The receptacle housing 154 extends between a mating end 162 and a mounting end 164, and has a thickness 166 defined between the mating and mounting ends 162, 164. The mounting end 164 defines an outer end of the mezzanine connector 102 (and may be referred to hereinafter as outer end 164) for mating with another component, such as the circuit board 104 or the mating adaptor 108, depending on the particular application. The receptacle contacts 156 extend from the outer end 164 for mating with the circuit board 104 or the mating adaptor 108. The receptacle housing 154 may comprise multiple housing pieces assembled together into a single body. Optionally, the receptacle housing 154 may include standoffs 168 at the mounting end 164 that engage the circuit board 104 when assembled thereto. As shown in FIG. 1, the standoffs 168 provide clearance between the circuit board 104 and the mounting end 164, which may define an air gap therebetween. The air gap may cool the components.

The receptacle contacts 156 are held by the receptacle housing 154 such that the first ends 158 of the receptacle contacts 156 are arranged proximate to the mating end 162 and the second ends 160 are arranged proximate to the mounting end 164. In an exemplary embodiment, the second ends 160 define pins that extend outward from the mounting end 164, and are thus exposed beyond the mounting end 164. The second ends 160 may be referred to hereinafter as pins 160. In an exemplary embodiment, the pins 160 constitute press-fit pins having compliant portions that allow the first ends 160 to be terminated into plated vias of the second mating adapter 108 by an interference fit. Alternatively, the pins 160 may constitute solder pins that may be received in plated vias and terminated thereto using reflowed solder. The first ends 158 define sockets that are configured to receive the second ends 140 of the header contacts 136 when mated thereto. Other types of mating interfaces may be provided in alternative embodiments at the first and/or second ends 158, 160.

The mating adapter 108 includes a body 170 having a plurality of conductors 172 extending therethrough. The body 170 may be manufactured from a rigid material, such as a plastic material. The body 170 extends between a mating interface 178 and a mounting interface 180, and has a thickness 182 defined between the mating and mounting interfaces 178, 180. In an exemplary embodiment, the body 170 is a substrate, such as a circuit board, and may be referred to hereinafter as adapter circuit board 170. Optionally, the adapter circuit board 170 may be manufactured from a material having a predetermined coefficient of thermal expansion that is substantially similar to a coefficient of thermal expansion of the first circuit board 104. As such, the interface between the adapter circuit board 170 and the first circuit board 104 is less susceptible to thermal mismatch and damage during changes in temperature.

The conductors 172 are defined by plated vias extending through the adapter circuit board 170, and may be referred to hereinafter as plated vias 172. The conductors 172 may include traces routed along a surface of, or along an inner layer of, the adapter circuit board 170, in addition to the plated vias. The conductors 172 may define signal conductors, ground conductors and/or power conductors. The conductors 172 may be routed through the adapter circuit board 170 by means other than plating. For example, the conductors 172 may be individual contacts held by the body 170.

In an exemplary embodiment, the mating interface 178 defines an interface configured for mating with the receptacle connector 132. For example, the plated vias 172 are arranged along the mating interface 178 to receive the press-fit pins defined by the second ends 160 of the receptacle contacts 156. The press-fit pins are electrically connected to the plated vias 172, such as by an interference fit. Optionally, the press-fit pins may include eye-of-the-needle type contacts for interfacing with the plated vias 172.

In an exemplary embodiment, the header contacts 136, the receptacle contacts 156 and the conductors 172 are arranged in pairs and are configured to carry differential pair signals. The pairs of signals are separated by header contacts 136, receptacle contacts 156 and conductors 172 representing grounds that are electrically commoned and at the same electrical potential. Optionally, at least some of the header contacts 136, the receptacle contacts 156 and the conductors 172 may constitute power contacts configured to convey power. The header contacts 136, the receptacle contacts 156 and the conductors 172 may have different characteristics, such as size, shape, positioning and the like depending on the type of contact, for example, signal, ground or power contact.

The header contacts 136, the receptacle contacts 156 and the conductors 172 are arranged within the header housing 134, receptacle housing 154 and adapter circuit board 170, respectively, such that the header contacts 136, the receptacle contacts 156 and the conductors 172 have respective footprints defining areas. For example, the receptacle contacts 156 have a predetermined pinout defining a receptacle footprint 190 at the mating end 162 defined by the outer perimeter of the receptacle contacts 156. The receptacle footprint 190 encompasses a first area 192 (shown by the dashed line). The pinout is defined by the arrangement or pattern of the receptacle contacts 156, such as the number of receptacle contacts 156, the spacing between the receptacle contacts 156, and the like. In an exemplary embodiment, the receptacle footprint 190 is substantially the same on the mounting end 164 and the mating end 162. Alternatively, the receptacle footprint 190 may be different on the mounting end 164 as compared to the mating end 162. For example, the footprints may be differently sized, thus having different areas, or shifted on the receptacle housing 154 in one or more directions, such that the footprints are not aligned on the mating and mounting ends 162, 164.

The conductors 172 have a predetermined pinout defining a conductor footprint 194 at the mating interface 178 defined by the outer perimeter of the conductors 172. The conductor footprint 194 encompasses a second area 196 (shown by the dashed line). The pinout is defined by the arrangement or pattern of the conductors 172, such as the number of conductors 172, the spacing between the conductors 172, and the like. In an exemplary embodiment, the conductor footprint 194 is substantially the same on the mating interface 178 and the mounting interface 180. Alternatively, the conductor footprint 194 may be different on the mounting interface 180 as compared to the mating interface 178. For example, the footprints may be differently sized, thus having different areas, or shifted on the adapter circuit board 170 in one or more directions, such that the footprints are not aligned on the mating and mounting interfaces 178, 180. The conductors 172 may be either more closely spaced or further spaced apart on the mounting interface 180 or the mating interface 178.

The conductor footprint 194 corresponds with a first circuit board footprint 198. The first circuit board footprint 198 complements the conductor footprint 194 (at the mounting interface 180 if different than the mating interface 178) such that the mating adapter 108 may be mounted to the first circuit board 104.

The header contacts 136 have a predetermined pinout defining a header footprint 200 at the mating end 142 defined by the outer perimeter of the header contacts 136. The header footprint 200 encompasses a third area 202 (shown by the dashed line). The pinout is defined by the arrangement or pattern of the header contacts 136, such as the number of header contacts 136, the spacing between the header contacts 136, and the like. In an exemplary embodiment, the header footprint 200 is substantially the same on the mounting end 144 and the mating end 142. Alternatively, the header footprint 200 may be different on the mounting end 144 as compared to the mating end 142. For example, the footprints may be differently sized, thus having different areas, or shifted on the header housing 134 in one or more directions, such that the footprints are not aligned on the mating and mounting ends 142, 144.

The header footprint 200 corresponds with a second circuit board footprint 204. The second circuit board footprint 204 complements the header footprint 200 (at the mating end 142 if different than the mounting end 144) such that the header connector 130 may be mounted to the second circuit board 106.

Figure 3:
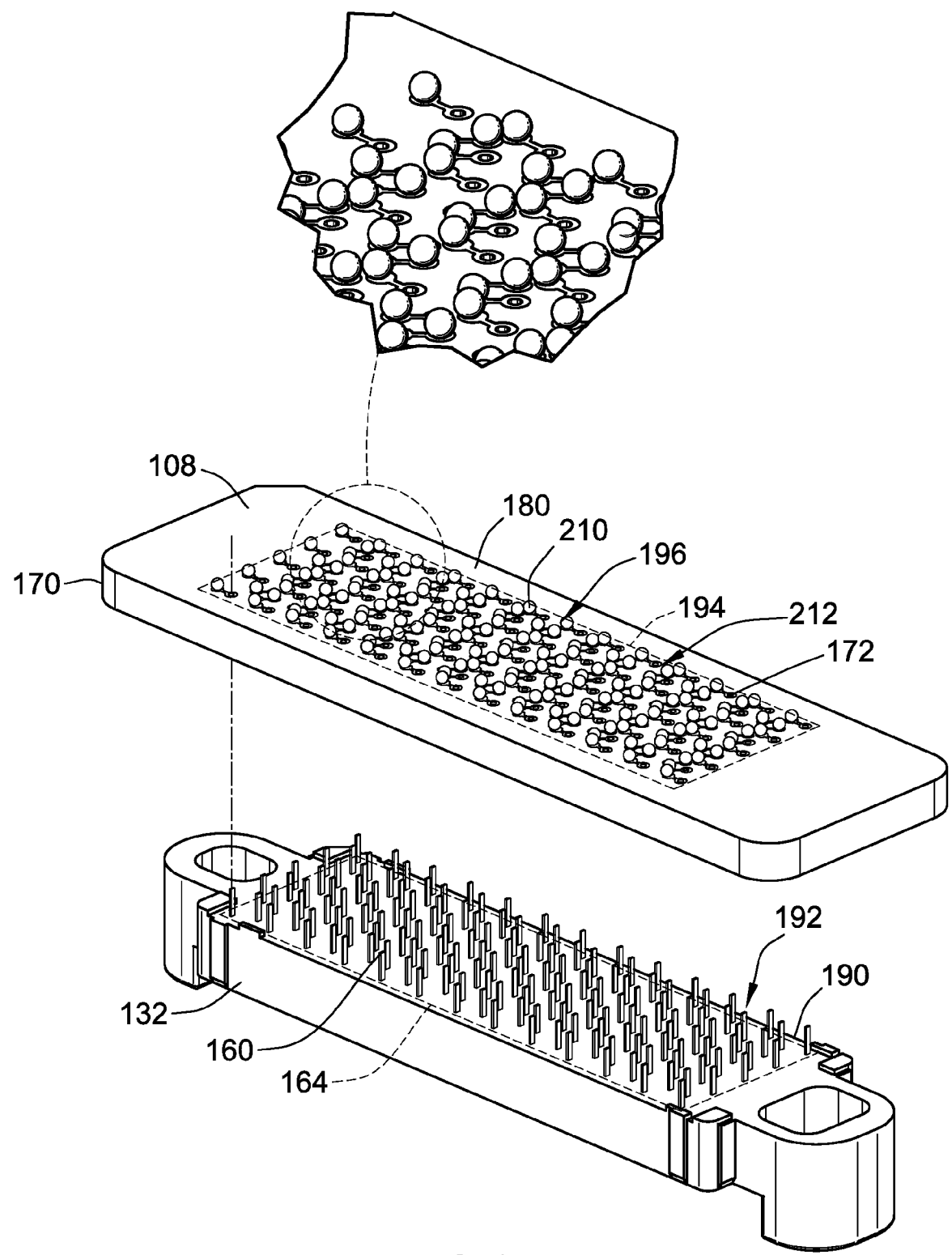
FIG. 3 is a bottom perspective view of a portion of the connector assembly shown in FIG. 1.

FIG. 3 is a bottom perspective view of the mating adapter 108 and the receptacle connector 132. As shown in FIG. 3, the second ends 160 define press-fit pins that extend outward from the mounting end 164, and are thus exposed beyond the mounting end 164. The second ends 160 may include compliant portions that allow the second ends 160 to be terminated to the conductors 172.

The mounting interface 180 of the adapter circuit board 170 includes a plurality of surface mount elements 210 terminated to the conductors 172. In an exemplary embodiment, the surface mount elements 210 constitute solder elements, such as solder balls and the solder balls define a ball grid array 212 at the mounting interface 180. Other types of solder elements may be used in alternative embodiments, such as solder paste, solder columns and the like. In other alternative embodiments, the surface mount elements 210 constitute compression contacts, such as spring beams, or other types of surface mount features. The surface mount elements 210 are configured for surface mounting to the first circuit board 104 (shown in FIG. 1). The surface mount elements 210 may be terminated to the conductors 172 using known techniques, such as using a conductive adhesive or epoxy, which may at least partially fill the plated vias defining the conductors 172, or being soldered to a pad forming part of, or extending from, the conductor 172 on the mounting interface 180. For example, dog bone shaped pads may be provided on the mounting interface 180, with one end of the dog bone pad being electrically connected to the conductor 172 and the corresponding surface mount element 210 being electrically connected to the other end of the dog bone pad. In an alternative embodiment, the ball grid array 212 may be provided on the first circuit board 104 with the mating adapter 108 be mounted to the ball grid array 212 during assembly.

In the illustrated embodiment, the conductor footprint 194 is substantially similar to the receptacle footprint 190. The conductors 172 generally pass straight through the adapter circuit board 170, and the surface mount elements 210 are terminated to the ends of the conductors 172 at the mounting interface 180. As such, the area 196 of the conductor footprint 194 is substantially similar to the area 192 of the receptacle footprint 190.

Figure 4:
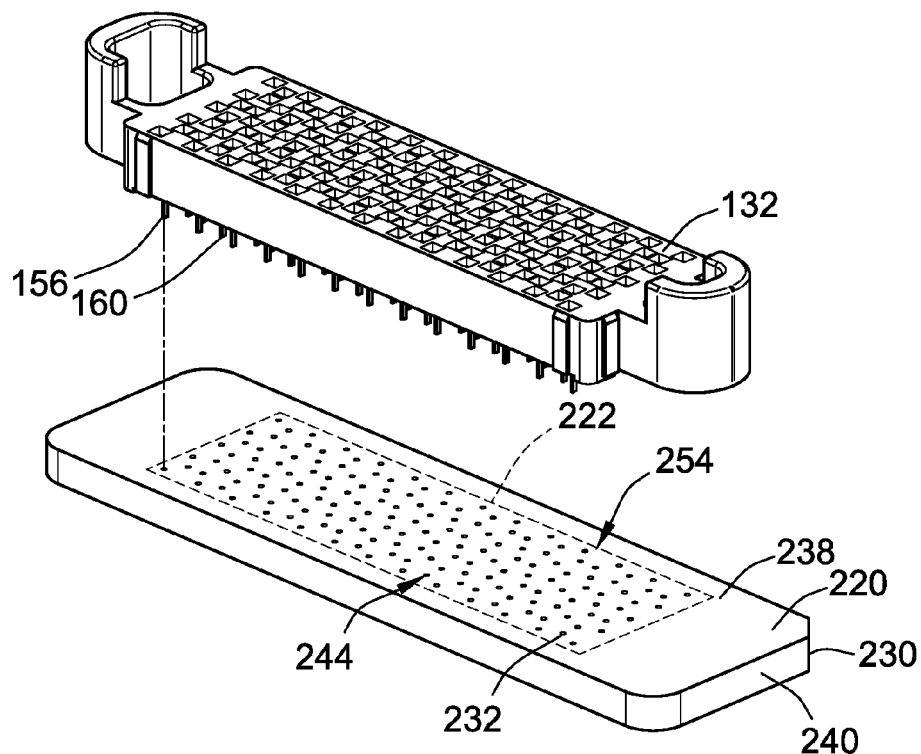
FIG. 4 is a top perspective view of an alternative mating adapter for the connector assembly shown in FIG. 1.
Figure 5:
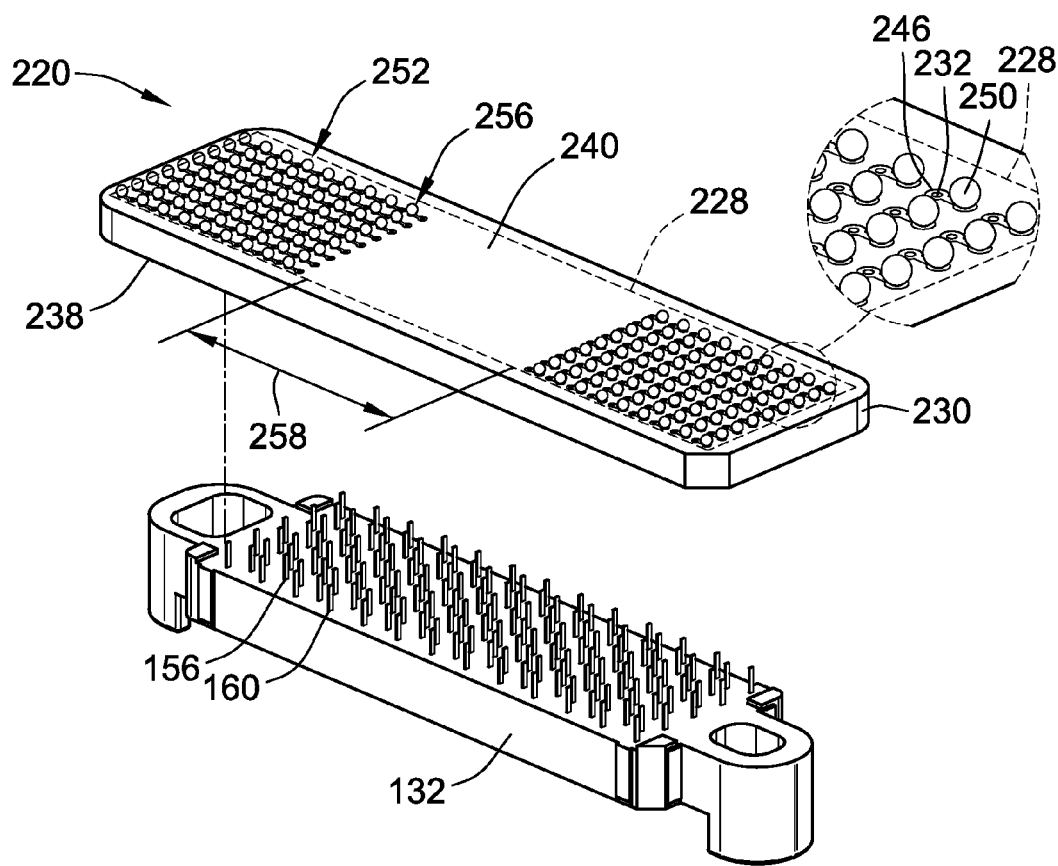
FIG. 5 is a bottom perspective view of the mating adapter shown in FIG. 4.

FIG. 4 is a top perspective view of an alternative mating adapter 220 for connection with the receptacle connector 132. FIG. 5 is a bottom perspective view of the mating adapter 220. The mating adapter 220 is similar to the mating adapter 108 (shown in FIG. 2), however the mating adapter 220 includes a first conductor footprint 222 at a mating end 238 thereof and a second conductor footprint 228 at a mounting end 240 thereof that is different then the first conductor footprint 222.

The mating adapter 220 includes a body 230 having a plurality of conductors 232 extending therethrough. In an exemplary embodiment, the body 230 is a substrate, such as a circuit board, and may be referred to hereinafter as adapter circuit board 230.

In the illustrated embodiment, the conductors 232 do not pass straight through the adapter circuit board 230. Rather, the conductors 232 are routed along non-linear paths through the adapter circuit board 230, such as on different layers of the adapter circuit board 230. As such, the conductors 232 are more spread out on the mounting end 240 than the mating end 238 such that the conductors 232 have a denser pinout pattern on the mating end 238 than the mounting end 240. Each conductor 232 may include a first plated via portion 244 (shown in FIG. 4), a conductive trace portion (not shown) and a second plated via portion 246 (shown in FIG. 5). The first plated via portion 244 extends from the mating end 238 at least partially through the adapter circuit board 230. The second plated via portion 246 extends from the mounting end 240 at least partially through the adapter circuit board 230. The conductive trace portion extends between corresponding first and second plated vias portions 244, 246. The conductive trace portion may be deposited on a layer of the adapter circuit board 230. Different conductive trace portions may be provided on different layers. The conductive trace portions route the conductors 232 to different areas of the adapter circuit board 230.

In an exemplary embodiment, the mating end 238 defines an interface configured for mating with the receptacle connector 132. For example, the first plated via portions 244 are configured to receive the press-fit pins defined by the second ends 160 of the receptacle contacts 156. The press-fit pins are electrically connected to the first plated via portions 244, such as by in interference fit. Optionally, the press-fit pins may include eye-of-the-needle type contacts for interfacing with the first plated via portions 244. In an exemplary embodiment, the first conductor footprint 222 at the mating end 238 is the same as the conductor footprint 194 (shown in FIG. 2) of the mating adapter 108 such that the receptacle connector 132 is configured to be mated with both the mating adapter 220 and the mating adapter 108.

The mounting end 240 of the adapter circuit board 230 includes a plurality of surface mount elements 250 terminated to the conductors 232. For example, the surface mount elements 250 may be terminated to the second plated via portions 246 or mounting pads extending along the mounting end 240 associated with the second plated via portions 246. In an exemplary embodiment, the surface mount elements 250 constitute solder elements, such as solder balls defining a ball grid array 252 at the mounting end 240, however other types of solder elements may be provided in alternative embodiments. In other alternative embodiments, the surface mount elements 250 may be compression contacts, such as spring beams, or other types of surface mount features. The surface mount elements 250 are configured for surface mounting to the first circuit board 104 (shown in FIG. 1).

The mounting end 240 of the mating adapter 220 has a different arrangement of conductors as compared to the mating end 238, and thus the second conductor footprint 228 at the mounting end 240 is different than the first conductor footprint 222 at the mating end 238. The footprints generally correspond with the components that the conductors 232 are mated to. For example, the pins 160 of the receptacle contacts 156 have a predetermined pinout corresponding to the first conductor footprint 222 and the surface mount elements 250 have a predetermined pinout corresponding to the second conductor footprint 228. The first conductor footprint 222 has a first area 254 and the second conductor footprint 228 has a second area 256 different than the first area 254.

In the illustrated embodiment, the conductors 232 at the mounting end 240 are more spread out than at the mating end 238. A large gap 258 is provided between two subsets of the conductors 232. When mounted to the first circuit board 104, the gap 258 provides an area on the first circuit board 104 that is free of mounting pads for receiving the surface mount elements 250. As such, the transmission paths 124 (shown in FIG. 2) through the first circuit board 104 may be subject to less signal degradation and/or may be provided in layers closer to the outer layer of the first circuit board 104, which may allow the first circuit board 104 to include less layers and thus be relatively thinner. In an alternative embodiment, rather than providing the large gap 258, each of the conductors 232 may be more spread out at the mounting end 240 than at the mating end 238. For example, a spacing between each adjacent second plated via portion 246 may be spaced further apart than each adjacent first plated via portion 244 in one or more directions (e.g. longitudinally and/or laterally) along the adapter circuit board 230.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and merely are example embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
   an electrical connector having a generally planar outer end and a plurality of pins extending from the outer end; and
   a mating adapter having a planar mating interface and a planar mounting interface, the mating and mounting interfaces being substantially parallel to one another, the mating adapter being coupled to the electrical connector such that the outer end of the electrical connector engages the mating interface with the pins extending into the mating adapter, the mounting interface being configured to engage a circuit board, the mating adapter having conductors extending between the mating interface and the mounting interface, the conductors receiving corresponding pins of the electrical connector, the mating adapter having surface mount elements arranged on the mounting interface, the surface mount elements being electrically connected to corresponding conductors, the surface mount elements being configured to be terminated to the circuit board to electrically interconnect the electrical connector and the circuit board.

2. The connector assembly of claim 1, wherein the mating adapter includes plated vias extending between the mating interface and the mounting interface, the plated vias defining the conductors, the plated vias receiving the pins.

3. The connector assembly of claim 1, wherein the mating adapter includes an adapter circuit board having plated vias extending therethrough defining the conductors, the surface mount elements being electrically connected to corresponding plated vias.

4. The connector assembly of claim 1, wherein the pins have a predetermined pinout defining a first footprint having a first area, and wherein the surface mount elements are arranged in a predetermined pinout defining a second footprint having a second area different than the first area.

5. The connector assembly of claim 1, wherein the mating adapter includes an adapter circuit board having a predetermined coefficient of thermal expansion substantially similar to a coefficient of thermal expansion of the circuit board.

6. The connector assembly of claim 1, wherein the conductors are routed through the mating adapter along non-linear paths such that the conductors have a denser pinout pattern on either the mating interface or the mounting interface.

7. The connector assembly of claim 1, wherein the electrical connector has a second outer end opposite the outer end, the second outer end having a plurality of pins, the connector assembly further comprising a second mating adapter having a mating interface and a mounting interface, the mating interface of the second mating adapter engaging the second outer end and the mounting interface configured to engage a second circuit board, the second mating adapter having conductors receiving the pins at the second outer end and surface mount elements being electrically connected to corresponding conductors, the surface mount elements of the second mating adapter being configured to be terminated to the second circuit board.

8. The connector assembly of claim 1, wherein the mating interface and the mounting interface are separated by a predetermined distance.

9. The connector assembly of claim 1, wherein the mating adapter includes a plurality of individual vias open at the mating interface, the vias having corresponding conductors therein, the vias receiving corresponding pins therein.

10. A connector assembly comprising:
    an electrical connector having first and second outer ends being configured to be electrically connected to first and second circuit boards, respectively, to electrically interconnect the first and second circuit boards, the electrical connector having first pins at the first outer end and the electrical connector having second pins at the second outer end; and a first mating adapter having a mating interface and a mounting interface, the mating interface engaging the first outer end and the mounting interface configured to engage the first circuit board, the first mating adapter having conductors extending between the mating interface and the mounting interface, the conductors receiving corresponding first pins of the electrical connector, the first mating adapter having surface mount elements arranged on the mounting interface, the surface mount elements being electrically connected to corresponding conductors, the surface mount elements being configured to be terminated to the first circuit board to electrically interconnect the electrical connector and the first circuit board.

11. The connector assembly of claim 10, further comprising a second mating adapter having a mating interface and a mounting interface, the mating interface of the second mating adapter engaging the second end and the mounting interface configured to engage a second circuit board, the second mating adapter having conductors receiving the second pins and second surface mount elements being electrically connected to corresponding conductors of the second mating adapter, the second surface mount elements of the second mating adapter being configured to be terminated to the second circuit board.

12. The connector assembly of claim 10, wherein the electrical connector and first mating adapter interconnect the first and second circuit boards in a parallel arrangement.

13. The connector assembly of claim 10, wherein the first mating adapter includes plated vias extending between the mating interface and the mounting interface, the plated vias defining the conductors, the plated vias receiving the first pins.

14. The connector assembly of claim 10, wherein the first mating adapter includes an adapter circuit board having plated vias extending therethrough defining the conductors, the surface mount elements being electrically connected to corresponding plated vias.

15. The connector assembly of claim 10, wherein the first pins have a predetermined pinout defining a first footprint having a first area, and wherein the surface mount elements are arranged in a predetermined pinout defining a second footprint having a second area different than the first area.

16. A connector assembly comprising:

an electrical connector having an outer end and a plurality of pins at the outer end, the pins having a predetermined pinout defining a first footprint having a first area; and a mating adapter having a mating interface and a mounting interface, the mating interface engaging the outer end and the mounting interface configured to engage a circuit board, the mating adapter includes an adapter circuit board having plated vias extending therethrough, the mating adapter receiving the pins of the electrical connector and having surface mount elements arranged on the mounting interface, the surface mount elements being electrically connected to corresponding plated vias.

17. The connector assembly of claim 16, wherein the electrical connector includes a second end configured to be electrically connected to a second circuit board, the electrical connector and the mating adapter interconnect the first and second circuit boards in a parallel arrangement.

18. The connector assembly of claim 16, wherein the electrical connector includes a second end configured to be electrically connected to a second circuit board, the connector assembly further comprising a second mating adapter having a surface mount element interface and a pin interface, the electrical connector, the mating adapter and the second mating adapter cooperate to interconnect the first and second circuit boards in a parallel arrangement.

19. The connector assembly of claim 16, wherein the surface mount elements being arranged in a predetermined pinout defining a second footprint having a second area different than the first area, the first footprint is smaller than the second footprint with the conductors at the mating interface being positioned relatively closer to one another and with the conductors at the mounting interface being positioned relatively further away from one another.

* * * * *